United States Patent [19]

Galm et al.

[11] Patent Number: 4,956,610
[45] Date of Patent: Sep. 11, 1990

[54] CURRENT DENSITY MEASUREMENT SYSTEM BY SELF-SUSTAINING MAGNETIC OSCILLATION

[75] Inventors: James M. Galm, Chardon; Mark E. Podany, Parma Heights, both of Ohio

[73] Assignee: PGM Diversified Industries, Inc., Parma Hts., Ohio

[21] Appl. No.: 155,205

[22] Filed: Feb. 12, 1988

[51] Int. Cl.⁵ .................. G01N 27/42; G01R 33/00
[52] U.S. Cl. ............................ 324/425; 324/117 R
[58] Field of Search .............. 324/425, 439, 441, 442, 324/444, 117 R, 127; 204/1 T; 427/8-10

[56] References Cited

U.S. PATENT DOCUMENTS

| | | | |
|---|---|---|---|
| 2,739,285 | 3/1956 | Windsor | 324/117 R |
| 2,780,781 | 2/1957 | Medlar | 324/117 R |
| 2,785,233 | 3/1957 | Stuart | 179/100.2 |
| 3,005,878 | 10/1961 | Wiegand | 179/100.2 |
| 3,454,879 | 7/1969 | Smitka | 324/117 R |
| 3,748,899 | 7/1973 | Gregg et al. | 324/441 |
| 3,774,184 | 11/1973 | Scarelli | 340/227 |
| 4,004,989 | 1/1977 | Ralston | 204/99 |
| 4,037,194 | 7/1977 | Boyden et al. | 340/63 |
| 4,082,642 | 4/1978 | Honig | 324/189 |
| 4,102,771 | 7/1978 | Hönig | 324/425 |
| 4,207,566 | 6/1980 | Gitlin et al. | 340/664 |
| 4,218,746 | 8/1980 | Koshiishi | 364/571 |
| 4,278,938 | 7/1981 | Morriss | 324/117 R |
| 4,286,211 | 8/1981 | Nakamura | 324/117 R |
| 4,489,277 | 12/1984 | Goolsby | 324/425 |
| 4,595,462 | 6/1986 | Vangaever et al. | 204/1 T |
| 4,627,905 | 12/1986 | Garner et al. | 204/1 T |
| 4,639,677 | 1/1987 | Goolsby | 324/425 |
| 4,644,285 | 2/1987 | Britton | 324/425 |
| 4,695,797 | 9/1987 | Deutsch et al. | 427/10 |
| 4,713,347 | 12/1987 | Mitchell et al. | 324/439 |

Primary Examiner—Reinhard J. Eisenzopf
Assistant Examiner—Maura K. Regan
Attorney, Agent, or Firm—Fay, Sharpe, Beall, Fagan, Minnich & McKee

[57] ABSTRACT

A system for measuring parameters in an environment having a metallic body positioned in an electrolytic medium includes a current density sensing device positioned adjacent the metallic body in a non-invasive manner. The device is sufficiently sensitive to measure current density in the milliamp per square centimeter range. A housing is provided for enclosing at least a portion of the current density sensing device in an electrically and thermally non-conductive manner. A computer is used for processing the data from the current density sensing device and wiring is provided for electrically interconnecting the two. The current density sensing device, which can be used separately from the apparatus, includes a toroidal transformer and a square wave magnetically coupled oscillator which drives the transformer. A pair of multi-section low pass filters are provided for monitoring the transformer. A fixed gain differential instrumentation amplifier is utilized for processing an output of the transformer. The processed transformer output is proportional to a current sensed by the transformer.

34 Claims, 4 Drawing Sheets

CURRENT DENSITY MEASUREMENT SYSTEM BY SELF-SUSTAINING MAGNETIC OSCILLATION

BACKGROUND OF THE INVENTION

This invention generally pertains to measuring devices. More specifically, the present invention relates to a device for measuring electrical current and, optionally, several other parameters.

The invention is particularly applicable to a current density measuring device which is utilized in an electrodeposition system in which a metallic body is positioned in an electrolyte. The primary measurement environment for the apparatus is an automotive electrocoating facility maintained either at an automobile plant or in a laboratory. However, it should be appreciated by those skilled in the art, that the invention has broader applications and may also be adapted for use in other environments where a measurement of current and, optionally, other parameters is required.

Electrodeposition of aqueous non-conductive polymer coatings onto a metallic substrate has risen to industrial prominence in recent years. This type of deposition process is generally considered to be a type of electrophoresis. The process has many advantages including relative uniformity and completeness of coating, even on intricate shapes. Virtually any electrically conductive substrate can be coated, however the process has been primarily employed to prime ferrous metal substrates.

The electrodeposition coating process (E-Coat) has become increasingly important in the coatings industry, because by comparison with non-electrophoretic coating means, electrodeposition offers higher paint utilization, outstanding corrosion protection, and low environmental contamination. Initially, the work piece being coated served as the anode in the electrodeposition process. This was familiarly referred to as anionic electrodeposition. However, in the early 1970's, cationic electrodeposition, in which the metallic part to be coated serves as the cathode, was introduced commercially. Since that time, cationic electrodeposition has steadily gained in popularity and is today by far the most prevalent method of electrodeposition. Currently, more than 80% of all motor vehicles produced around the world are given a base coat or a primer coat by cationic electrodeposition.

The process involves immersing the car body or car parts in a conductive electrolyte bath in a tank. The E-Coat bath is a water thin electrolytic resin mixture that is kept in the tank under constant turbulent agitation. The car body becomes a cathode and several anodes are attached to tank walls to act as the other electrode in the circuit. A direct current voltage between approximately 200 to 400 volts is applied between the cathode and the tank anodes. When proper conditions occur at the metal surface, i.e. correct pH, minimum current density, etc., the resin precipitates onto the metal. The resin forms a film which, after curing, can be on the order of between 1 to 2 mils (0.0254 to 0.0508 millimeters) in thickness.

Ideally, a uniform coating thickness is desired on all body surfaces. Problems arise when non-uniform deposition occurs causing widely varying thicknesses of resin coating on different parts of the body. This can cause the car body to be rejected and scrapped, at a tremendous expense to the vehicle manufacturer. Even if the body is used, uneven coatings can lead to an early corrosion of the portion of the body which was not coated with a sufficiently thick layer of the resin.

Since electrocoating is a current driven process, measurement of the current density on different parts of a car body would provide data on and an insight into how the process could be optimized to obtain a more uniform coating layer on the car body. Collected data would aid in solving problems occurring in electrocoating systems presently installed as well as aid in the design of new electrocoating facilities.

At the moment, no suitable current measuring device exists for this type of environment. Standard current measuring devices are not sensitive enough to measure the current density in an E-Coat bath with precision. Additionally, no standard current measuring devices are available which can be used in the harsh and corrosive E-Coat bath environment. It would be advantageous to provide such a current measuring device. It would also be advantageous to provide an apparatus which is capable of measuring several different parameters in an environment having a metallic body positioned in an electrolytic bath.

Accordingly, it has been considered desirable to develop a new and improved current measuring device, as well as an apparatus which can be used for measuring current density and other parameters, which would overcome the foregoing difficulties and others and meet the abovestated needs while providing better and more advantageous overall results.

BRIEF SUMMARY OF THE INVENTION

According to one aspect of the invention, a current measuring device is provided.

More specifically in accordance with this aspect of the invention, the device comprises a toroidal transformer and a square wave magnetically coupled oscillator which drives the transformer. Two multi-section low pass filters are provided for monitoring the transformer. A fixed gain differential amplifier is provided for processing an output of the transformer, wherein the amplifier output contains an encoded value related to a current sensed by the transformer.

According to a further aspect of the invention, the device further comprises a means for compensating for small output offsets due to component tolerance errors.

According to a still further aspect of the invention, the device further comprises a means for improving the sensitivity of the transformer. The means comprises a pair of voltage-sharing resistors.

According to a yet further aspect of the invention, the device further comprises a means for calibrating the amplifier.

According to a still yet further aspect of the invention, the amplifier is monolithic precision instrumentation amplifier.

In accordance with another aspect of the present invention, a system is provided for measuring parameters in an environment having a metallic body positioned in an electrolytic medium.

More specifically in accordance with this aspect of the invention, the system comprises a current density sensing means positioned adjacent to the metal body in a non-invasive manner and sufficiently sensitive to measure current density in the milliamp per square centimeter range. A housing means is provided for enclosing at least a portion of current density sensing means in an electrically and thermally non-conductive manner. A computer means is provided for processing the data from the current density sensing means. A wiring means is provided for electrically interconnecting the computer means with the current density sensing means.

According to another aspect of the invention, the system further comprises a temperature sensing means and a voltage sensing means each of which is located adjacent to the current density sensing means in said housing means. The wiring means also interconnects the temperature and voltage sensing means with the computer means so that the computer means can process the data therefrom.

According to yet another aspect of the invention, the system further comprises a data processing means for processing an output signal from the current density sensing means before the output signal is sent to the computer means.

According to still yet another aspect of the invention, the system further comprises an enclosure means for housing the computer means and the data acquisition means in an environmentally isolated manner.

According to yet still another aspect of the invention, the system further comprises a trigger probe means for setting the initiation of a measuring cycle with the apparatus. The trigger probe means is in electrical contact with the data acquisition means. Preferably, the trigger probe means comprises a housing, a means for securing the housing to the metallic body and at least one sensor exposed to the electrolytic medium.

According to still another aspect of the invention, the system further comprises a means for securing the housing means to the metallic body.

In accordance with still another aspect of the invention, the current density sensing means comprises a toroidal transformer and a square wave magnetically coupled oscillator which drives the toroidal transformer. A pair of voltage sharing resistors are provided for improving the sensitivity of the transformers. A pair of multi-section low pass filters are also provided for monitoring the transformer. A fixed gain differential instrumentation amplifier is provided for processing an output of each of the filters.

In accordance with yet another aspect of the invention, a plurality of housing means are provided, each containing a current density sensing means. A plurality of wiring means are provided, each connecting a current density sensing means in one of the housing means to the computer means.

In accordance with yet another aspect of the invention, the system further comprises a means for providing electrical power to the current density sensing means.

According to another aspect of the invention, a method is provided for obtaining data concerning the deposition of a polymer resin onto a metallic substrate positioned in an electrolytic medium held in an electrocoating tank.

According to this aspect of the invention, the method comprises providing a current density sensor, which is sensitive enough to measure current density in the range of milliamps per square centimeter, and securing the sensor to a metallic substrate. The substrate is lowered into an electrolytic medium held in an electrocoating tank. A current is passed through the medium thereby depositing a polymer resin contained in solution in the electrolytic medium onto the substrate. Current density is detected in the electrolytic medium adjacent the sensor and information regarding the current density that is detected by the sensor is recorded.

One advantage of the present invention is the provision of a new and improved current measuring device which is particularly adapted for measuring current density.

Another advantage of the present invention is the provision of a current density measuring device that is sensitive enough to measure current density in milliamps per square centimeter.

Still another advantage of the present invention is the provision of a current density measuring device which can be utilized in a measurement apparatus that also measures temperature and voltage or potential.

Yet another advantage of the present invention is the provision of an apparatus for measuring parameters including current density and, optionally, temperature and voltage in the environment of a harsh and corrosive electrolytic medium in which a metallic body is positioned.

A further advantage of the present invention is the provision of an apparatus which can measure current density in an electrolytic deposition process in a noninvasive manner at a plurality of locations on the metallic body which is meant to be electrocoated.

A still further advantage of the present invention is the provision of an apparatus for measuring current density and, optionally, other parameters and storing the information until the apparatus is removed from the measurement environment so that the information can then be read out.

Still other benefits and advantages of the invention will become apparent to those skilled in the art upon a reading and understanding of the following detailed specification.

BRIEF DESCRIPTION OF THE DRAWINGS

The invention will take form in certain parts and arrangements of parts, a preferred embodiment of which will be described in detail in this specification and illustrated in the accompanying drawings which form a part hereof and wherein.

DETAILED DESCRIPTION OF THE PREFERRED EMBODIMENT

Figure 1:
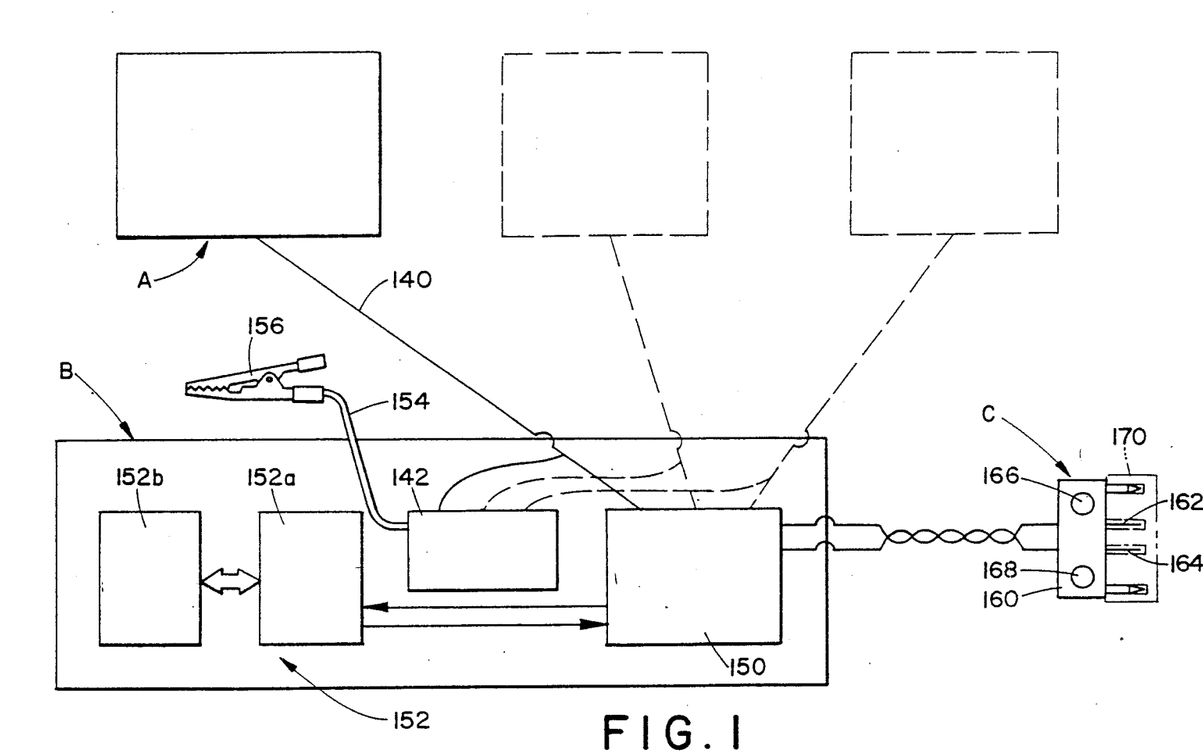
FIG. 1 is a block diagram of an apparatus for measuring parameters in an electrocoating bath environment including at least one sensing probe, a housing containing a signal processing means and a trigger probe.

Referring now to the drawings, wherein the showings are for purposes of illustrating a preferred embodiment of this invention only and not for purposes of limiting same, FIG. 1 shows in block diagram form the apparatus for measuring parameters such as current density, temperature and potential in a relatively harsh environment. The apparatus comprises at least one probe A which is electrically connected to a housing B that contains at least one signal processing and signal recording means. Extending from the housing is a trigger probe C for beginning the measuring process. While the inventive apparatus will be described and illustrated in connection with the measurement of parameters in an E-Coat bath environment, it should be appreciated that the apparatus could be used in a wide variety of environments and that the current density measuring device incorporated in the apparatus could be used separately.

In other words, the current density measuring device can be utilized to measure current density in a wide variety of measuring environments and not just in an electrodeposition bath. Such environments include, for example, electroplating and cathodic protection systems. More generally, the current measuring device disclosed herein could be used for making various types of direct current measurements where relatively small D.C. currents (i.e. milliamps) need to be measured, e.g. measuring a current in a conductor. Accordingly, it should be appreciated that while the device will be described as being useful particularly for making current density measurements, the device can also be used for making various other types of current measurements.

Figure 2:
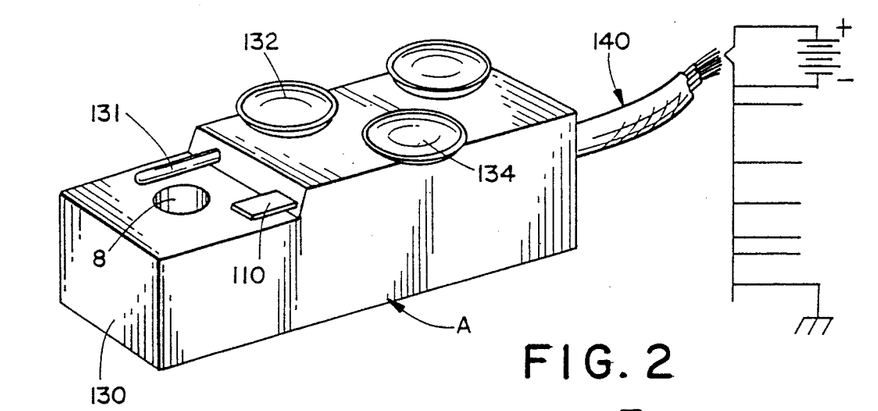
FIG. 2 is a perspective view of a sensing probe of FIG. 1.
Figures 3, 4, 5:
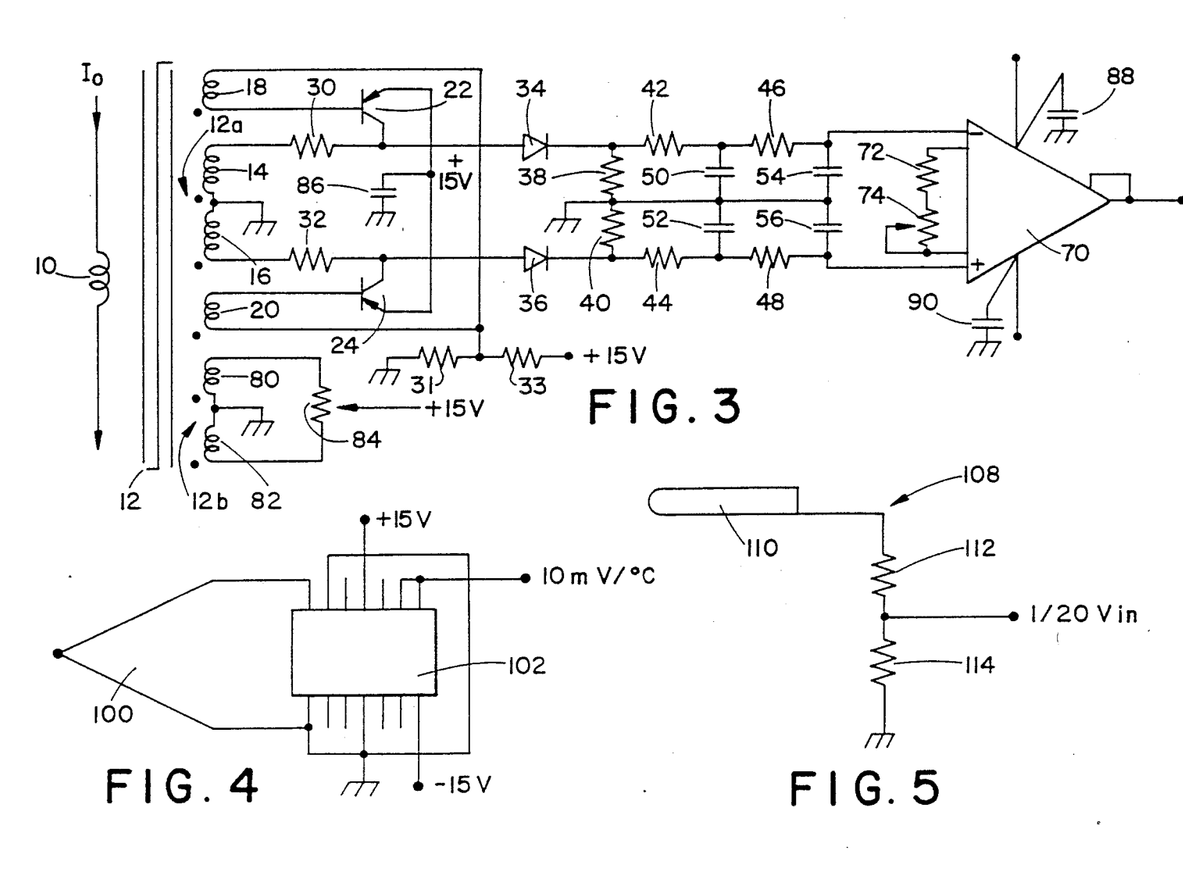
FIG. 3 is a schematic diagram of a current density measuring device or sensor of the sensing probe of FIG. 1.
FIG. 4 is a schematic diagram of a temperature sensor of the sensing probe of FIG. 1.
FIG. 5 is a schematic diagram of a potential or voltage sensor of the sensing probe of FIG. 1.

The current density sensor of FIG. 1 will be discussed first hereinbelow. With reference now to the electrical circuit diagram of FIG. 3, the current density sensor according to the present invention includes an apparatus which measures a current density in a conductive medium that passes through a fixed diameter bore (8 as illustrated in FIG. 2) to produce a total current $I_o$. In FIG. 3, 10 represents a one turn winding created by a transformer core of a transformer 12 that is constructed out of square loop magnetic material having a moderate saturation flux density and a sharply defined saturation state. The transformer 12 is comprised of a core about which the single turn winding 10; first and second center-tapped windings 12a, 12b; and first and second feedback windings 18, 20 are wound. All windings are related in direction by the dot convention illustrated in FIG. 3. A pair of associated transistors 22, 24 function to interconnect the center-tapped winding 12a to form a magnetically coupled oscillator circuit.

Each transistor 22, 24 acts as a switch, allowing current to alternately pass through winding halves 14, 16 of the first center-tapped winding 12a in alternate directions as dictated by which transistor is in the saturation state. Feedback is generated by the windings 18, 20 which are coupled to the bases of the first and second transistors 22, 24. When the first transistor 22 is in the saturation state, current flows into the winding 14, developing a positive voltage on the winding 20 with respect to a fixed DC bias, and a negative voltage on the winding 18 as long as the transformer is not saturated. Thus, the first transistor 22 is maintained in a saturation state while the second transistor 24 is clamped off.

This condition holds until the transformer core enters flux saturation. As the core saturates, its internal magnetic field stops changing, thus by Faraday's Law of Induction, the feedback voltages developed by the feedback windings 18, 20 become zero with respect to the fixed DC bias. At this point, the second transistor 24 enters saturation also allowing current to flow to coil 16 of the first center-tapped winding 12a. This abrupt change in net current produces a feedback pulse of opposite polarity to be generated in the windings 18, 20, causing the first transistor 22 to be clamped off and the second transistor 24 to enter saturation.

The second half of the oscillator period operates exactly as described above, except that the roles of the first and second transistors 22, 24 are reversed. Thus, sustained oscillations are produced by the circuit. Third and fourth resistors 31, 33 of the circuit apply a static DC bias to both of the transistor bases such that under static non-oscillating conditions both transistors are biased slightly into saturation. This ensures that the circuit will begin oscillation on power up regardless of the previous magnetization state of the transformer 12.

The amount of time required for each half of the oscillator period is determined by the number of total volt-seconds of flux linkage supported by the core of the transformer 12. Since the transformer core saturates at a well defined total flux, determined by the magnetic material characteristics and the geometry of the core, the transformer supports a well defined number of volt-seconds of flux linkage between saturation in either of the two possible directions. The voltage applied to the first center-tapped winding 12a is a function of the fixed supply voltage and of the voltage drop across the first and second resistors 30, 32 and hence the current drawn by the transformer 12 during the transition from one saturation state to the other. This current can be determined from the induction characteristics of the magnetic material and the core geometry. The time required for transition from one saturation state to the other is equal to twice the total flux linkage of the first center-tapped winding 12a divided by the voltage applied to windings 14, 16. Hence, the frequency of oscillation can be determined.

The external current $I_o$ generates a static flux within the transformer 12 that adds to or subtracts from the flux due to current in the first center-tapped winding 12a. Since the saturation flux linkage of the core is fixed, the amount of flux linkage that the first and second transistors 22, 24 must apply to saturate the transformer 12 is proportionally increased or reduced depending upon the direction of $I_o$. Changing the transition current drawn by the transformer 12 alters the voltage drop across the first resistor 30 or the second resistor 32 thus changing the voltage applied to windings 14, 16 by an amount proportional to $I_o$. Hence, windings 14, 16 and respective resistors 30, 32 share the voltage applied by the transistors, providing a highly sensitive and stable device. Since the transition time is inversely proportional to the voltage applied to windings 14, 16, the transition time is altered in proportion to $I_o$. Because $I_o$ acts in opposite directions with respect to the two coils 14, 16 of the first center-tapped winding 12a, one half of the oscillator period is shortened by exactly the amount that the other half is lengthened. Thus, the net oscillator frequency is not changed by the application of $I_o$ but the symmetry of the oscillator output is changed almost in direct proportion to $I_o$.

The circuit thus far described is capable of measuring current density due to the presence of the first and second resistors 30, 32. The transition time is proportional to the voltage applied to the two coils 14, 16. $I_o$ causes more or less current to be drawn by the coils 14, 16. Changing the current through the resistors 30, 32 changes the voltage on the coils 14, 16 - thus also changing the transition time. The transition time difference between the two halves enables one to derive current density.

First and second diodes 34, 36 along with fifth and sixth resistors 38, 40 in the circuit strip the negative half of the collector voltage of each transistor to provide clean square wave signals. Each signal is in a "high" state when its respective transistor is in saturation and in a "low" state when that transistor is cut off. Diodes 34, 36 along with resistors 38, 40 provide nearly ideally symmetric square pulses, allowing highly accurate measurements.

A plurality of resistors, namely seventh, eighth, ninth, and tenth resistors 42, 44, 46, and 48 together with a plurality of capacitors namely first, second, third, and fourth capacitors 50, 52, 54, and 56, apply a pisection low pass filter to each half of the oscillator output, to remove high oscillator frequency outputs. The resulting slowly varying DC signals are then proportional to the respective amounts of "on" time that each half of the oscillator experiences.

An amplifier 70, which is preferably a precision monolithic instrumentation amplifier, measures and amplifies the difference in voltage of the two filtered oscillator outputs. The use of an instrumentation amplifier instead of a simple operational amplifier is advantageous because it provide the instrument with less drift and tighter calibration tolerances than a simple operational amplifier could provide. The device has a very stable voltage gain, a high input impedance and a low output impedance. It can be shown that the differential voltage is, within a defined range of $I_o$, proportional to $I_o$. Thus, the circuit provides a continuous output voltage that varies in direct proportion to $I_o$.

Eleventh and twelfth resistors 72, 74 are in circuit with the amplifier 70 to set the amount of voltage gain applied by the instrumentation amplifier to the differential voltage. This provides a means for calibrating the instrument.

The second center-tapped winding 12b has first and second halves 80, 82. The winding halves 80, 82 together with a thirteenth resistor 84 provide a means to compensate for small output offsets due to component tolerance errors, providing a means to set a zero output value.

A plurality of additional filter capacitors 86, 88, and 90 are advantageously provided in the circuit as power supply coupling capacitors to provide improved circuit stability.

The current sensor described herein can measure DC currents passing through the bore of the transformer. Therefore, DC current densities can be measured as defined by the fixed area of the bore. The device can be calibrated to measure a current density up to 30 mA/cm$^2$ with a precision of better than ±0.9 mA/cm$^2$.

The probe A illustrated in FIG. 1 also includes a temperature sensor. Measuring the temperature is useful in a probe employed for measuring parameters in an electrodeposition process. The temperature sensor indicates when that probe enters the electrodeposition bath since the temperature will increase from ambient (circa 20° C.) to bath temperature (circa 37° C.). The temperature of the electrolyte bath is an important parameter in that the maintenance of proper chemical kinetics at the electrolyte - metal boundary is directly related to temperature. Because diffusion processes occurring at this boundary are highly temperature dependent, the measurement of temperature can be critical to the evaluation and understanding of the E-Coat process. Thus, an increased local temperature could imply a localized resin depletion in the bath from a lack of mixing.

With reference now more particularly to FIG. 4, the temperature sensor is suitably a transducer comprising a conventional type K thermocouple 100 and a monolithic thermocouple amplifier unit 102. These can be attached to the same circuit board as the current density sensor if desired. The thermocouple is electrically isolated from the environment in which it is sensing the temperature in order to preclude possible damage to the amplifier unit 102 by high voltages appearing on the thermocouple leads when immersed in an electrically conductive medium such as an E-Coat bath. The thermocouple amplifier provides a voltage output corresponding to sensed temperature. The approximate linear transfer function of the thermocouple of the preferred embodiment is 10 millivolts per degree Centigrade.

Also provided in the probe A is a voltage or potential sensor. Measurement of the voltage or electric potential is desirable in that such information can be loosely indicative of the relative amount of resin film build on the metallic substrate in the vicinity of the probe, by virtue of the high resistivity of the deposited film with respect to the water-thin resin E-Coat bath.

With reference now more particularly to FIG. 5, the voltage sensor 108 comprises an electrically conductive sensing element 110 which may be a conductive plate or a tube that is exposed to the measurement environment in which potential is to be measured. The element 110 is connected to a resistive voltage divider network comprising resistors 112, 114. The voltage sensor is suitably contained on the same circuit board as the temperature sensor and the current density sensor, if that is desired. The voltage divider network acts as a 20 to 1 attenuator (i.e. 20 volts in yields 1 volt out) with an input impedance of approximately 20 megohms. The importance of this relatively high input impedance will be discussed hereinbelow.

The probe A illustrated schematically in FIG. 1 is illustrated in perspective form in FIG. 2. As shown in FIG. 2, the sensors on the probe are preferably at least partially encapsulated in a probe body 130 that is made from an electrically and thermally insulating inert material such as silicone rubber to protect and insulate the measurement electronics from the electrical and thermal hazards of the measurement environment. The encapsulation protects the sensors from corrosion and from the electrolytic medium and also acts as mechanical protection for the measurement electronics and the internal mechanical assembly. As mentioned above, preferably the current density sensor, the temperature sensor, and the potential sensor share a common circuit board which is not visible in FIG. 2.

The voltage or potential sensing element 110 is exposed to the measurement environment but the current density sensor is completely encapsulated. As mentioned, the thermocouple (not visible in FIG. 2) is covered by a sheath 131 to electrically isolate it from the measurement environment.

Preferably, conventional suction cups 132, 134 are provided on the body 130 as a means for securely fastening the probe in the measurement environment in a readily detachable manner. Suction cups offer advantages over other mechanical attachment means such as magnets or the like due to the fact that magnets induce a static magnetic field in the vicinity of the probe and this could cause distortions in both the process being measured and the mechanism by which the current densities are measured. Preferably, the suction cups are made of a suitable elastomeric material such a rubber. The suction cups can be provided on more than one surface of the probe body 130, if that is desired, to allow some flexibility in the securing of the probe body to a work piece in the measuring environment.

Electrical power to the probe assembly A is provided through a conductor cable 140 which also provides a path for electrical signals representing the measured quantities to be transmitted. The cable 140 is preferably double shielded to reduce noise pickup. Power for the probe can be provided through a suitable conventional power supply which can be an 18 volt DC gel cell power supply 142 positioned in the enclosure B as shown in FIG. 1. The raw power is preferably regulated down to +15 volt DC and −15 volt DC on the circuit board by means of conventional monolithic voltage regulator integrated circuits. The regulated and filtered power provides all the power requirements of the measurement electronics contained in the probe assembly.

The cable 140 of a typical probe utilizes eight conductors as is illustrated in FIG. 2. Two of the conductors are for the plus and minus 18 volt DC raw power flowing to the probe. Three conductors are provided, respectively, for the current density signal, the temperature signal, and the potential signal. Two additional conductors are provided for thermocouple testing. Finally, one conductor is provided as the power supply/signal ground line. The shield of the cable is tied to the power supply/signal ground at the power supply/signal output end of the cable to prevent currents induced in the shield from causing erroneous voltage shifts to appear between ground potential at the power supply and the signal ground at the probe.

With reference now again to FIG. 1, the measurement system can comprise a plurality of probes A together with the power supply 142 for them as well as a data acquisition unit 150 and a control computer 152. Included in the central computer is a CPU 152a and a memory 152b. While three probes are illustrated in FIG. 1, it is contemplated that as many as nine probes would be used in a full measurement system. However, it should be appreciated that more or less than that number of probes could be used depending on the number of probes required for a particular application.

It should be noted that a divider ground is connected in common with the system ground for connecting all of the previously mentioned circuits into one ground. A system ground 154 can be connected to the metallic substrate via alligator clips 156 or a similar means in order to reference all potential measurements to the metallic substrate.

The housing B preferably accommodates the power supply 142, the data unit 150, and the computer 152 and preferably comprises an environmentally secure enclosure 154 which can be selectively opened as necessary. In one preferred embodiment, the system comprises a Hewlett Packard 3421A data acquisition unit and a Hewlett Packard HP-75 computer. Both the data acquisition unit 150 and the computer 152 are preferably provided with an internal power means which can be rechargeable, nickel-cadmium batteries or the like (not illustrated). Alternatively, the power supply 142 for the probes could also be suitably configured to supply power to the control computer and the data acquisition unit if desired.

The data acquisition unit 150 receives the measured values from the probes under control of the computer in the form of voltage measurements. The computer is also responsible for storing the collected data until the end of the measurement cycle at which point the data may be stored on magnetic media or kept in the computer's continuous memory. The data acquisition unit and the computer communicate via a suitable instrument loop serial communications link 154 which in the preferred embodiment is a Hewlett Packard Instrument Loop (HP-IL) link.

During the measurement process, only the control computer, the data acquisition unit, and the power supply are contained inside the environmentally secure enclosure B. The probes A are connected to the power supply 142 and the data acquisition unit 150 via conventional waterproof plastic connectors (not illustrated) on the enclosure 154 in order to maintain the environmental integrity of the enclosure and to prevent exposure of the computer 152 and the data acquisition unit 150 to the measurement environment.

In the preferred embodiment, the data acquisition unit is capable of acquiring data from 30 channels. However, the measurement system herein envisioned utilizes only 27 channels for data (9 probes) and one channel as a system trigger. It is evident that data acquisition units having other channel capacities can also be utilized as needed. After the data acquisition unit and the computer have been placed in the enclosure and power has been applied to the probes, the probes are attached via the suction cups 132, 134 to the metallic body which will be exposed to the measurement environment. Once the probes are attached, the data acquisition program in the computer can be started. Actual measurements will not be taken until the system is triggered via the trigger probe C.

The trigger probe can comprise a rectangular plastic block housing 160 in which a pair of wires 162, 164 are securely fastened. The ends of the wires have been stripped of insulation and have been solder tinned leaving approximately one half inch of wire exposed to the measurement environment. The block 160 also contains a pair of ceramic magnets 166, 168 which are used to attach the trigger probe to the metallic substrate. The trigger probe can also be provided with a removable protective sheath 170 to protect the probe wires 162, 164 when not in use, and also to prevent accidental triggering during the attachment of the probes.

Figure 7:
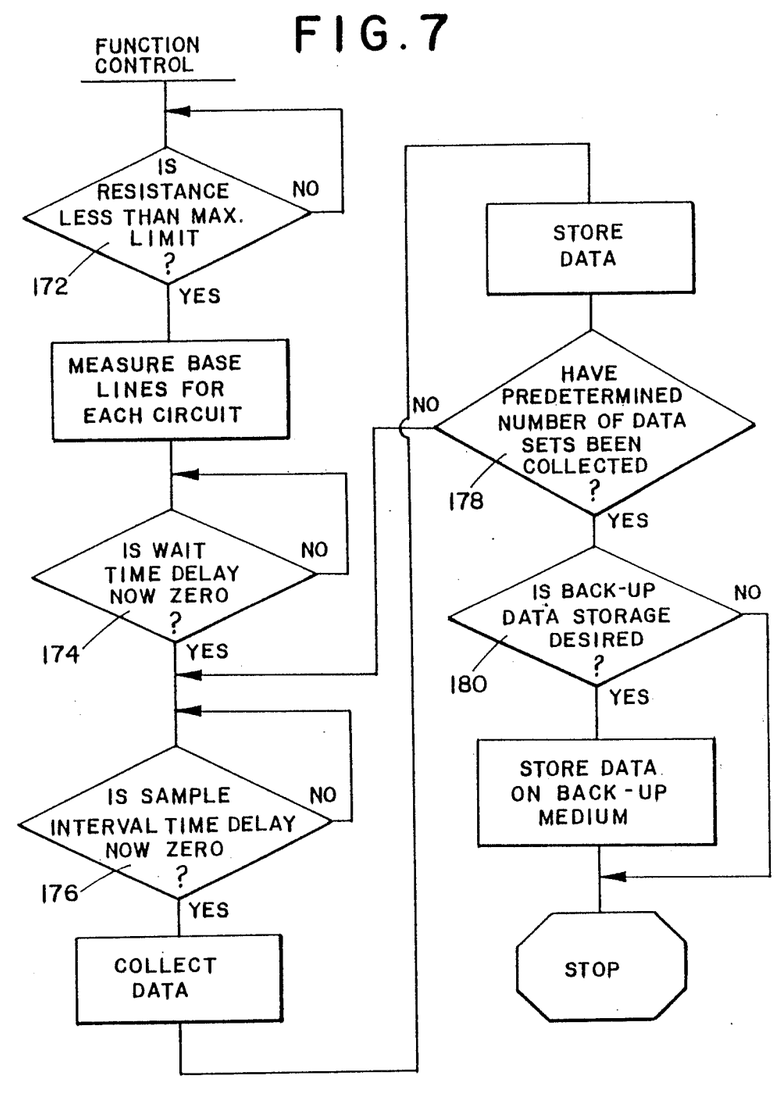

With reference now to FIG. 7, the functioning of the software routine for acquiring data is there illustrated. The computer waits in loop examining channel zero of the data acquisition unit. Channel zero, previously configured for performing a two wire resistance measurement, is the channel used to trigger the measurement cycle. Triggering occurs when the trigger probe is immersed in the measurement environment and "sees" a resistance between the two wires that is less than 80,000 ohms, as shown in block 172. After triggering, base line measurements can be made for each of the current density circuits in the several probes A. These are stored in the computer 152 and used to zero out any offsets that may be developed.

A variable software wait routine is suitably programmed into memory 152b of the computer 152 (FIG. 1) so that the program will wait a specified number of seconds before commencing data collection after triggering. Such a wait period, as shown in block 174, is highly desirable since under certain measurement conditions the measurement environment may have to stabilize. The maximum number of data sets in this embodiment is fifty and is determined by the amount of physical memory contained in the computer as the computer's memory is apportioned for both program and data storage. A minimum sample interval between measurements is 1.5 seconds. In other words, this period of time must elapse between each two measurements as shown in block 176. The interval is constrained by the data acquisition unit 150 and the finite length of time that is needed to make each measurement. In the preferred embodiment, the minimum sample interval is constrained by the HP 3421A data unit's dual slope integrating analog to digital converter. In general the absolute minimum measurement interval would be limited only by the probe's bandwidth. Since the probe has a −3 db bandwidth of 3–4 Hz, the sampling frequency would be limited to approximately 1½ to 2 Hz.

The program queries whether the predetermined number of data sets has been collected, as shown in block 178. If not, the program returns to the sample interval time delay query. Upon completion of data collection, the program initiates a query whether the user would like the newly collected data to be stored on magnetic media as a back-up precaution as shown in block 178. After program termination, the data is maintained in the computer's continuous memory until deleted. Once data collection has been completed, the computer can be turned off and disconnected from the data acquisition unit and removed from the enclosure. With the data stored safely in the computer's memory, or in memory and on a magnetic medium, an indefinite amount of time may elapse before the data is retrieved. After the instrument has been removed from the measurement environment, the computer can be connected to a suitable conventional printer (not illustrated) for printing or plotting the collected data. The HP-IL instrument loop 154 can be used to interface the printer with the computer 152 during text and graphic output operations.

A suitable data collection program reads the collected data and prints the potential, current density and temperature data in a table form for easy visual comparison. After all the data has been printed, a suitable second program, which can be a plotting program can be called in order to plot magnitudes of potential, current density and temperature against time.

Figure 6:
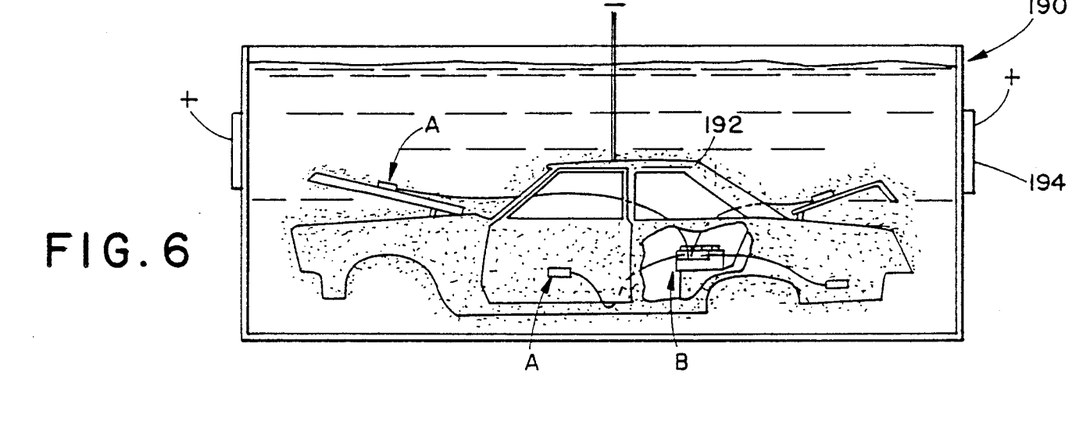
FIG. 6 is a side elevational view illustrating the use of the apparatus of FIG. 1 in an electrodeposition coating bath environment; and, FIG. 7 is a block diagram flow chart of a method of measuring current density using the apparatus of FIG. 1.

With reference now to FIG. 6, one suitable measurement environment for the previously described measurement instrumentation is an automotive electrocoating bath. An automotive electrocoating facility which is maintained at an automobile plant comprises a suitable tank 190 for holding the E-Coat bath. The tank can be up to 150 ft. long, 12 ft. wide, 10 ft. high, and open on the top. A plurality of automobile bodies are moved through the tank in a relatively continuous process. One such automobile body 192 is shown in FIG. 6. The body 192 acts as the cathode of the electrodeposition system. Suitable anodes 194 are provided on the walls of the tank. In various electrocoating tanks, the anodes can be located in different places on the tank and can have varying shapes.

The electrocoating environment is a hostile environment which is quite destructive. The E-Coat bath itself is a water thin electrolytic resin mixture that is kept in the tank 190 under constant turbulent agitation. One such resin composition is a cationic resin which contains blocked isocyanate curing agents and is available from PPG Industries, Inc. under the trademark UNIPRIME. The E-Coat process by which metallic parts such as car bodies or parts of car bodies are coated with a polymer resin layer involves submersion of the parts in the bath and the application of a DC voltage between the car part or body which acts as the cathode, and the anodes 194 located on the tank walls. When the proper conditions occur at the metal surface, i.e. correct pH, minimum current density, etc. the resin precipitates onto the metal.

Since the metal conductor measuring bath potential can also act as a cathode, it would also be prone to coating just as the other metal parts in the tank if the current flowing through the circuit, and hence the current density on the conductor, were above the minimum required for deposition. The high impedance (20 megohms) of the circuit ensures that any currents flowing through the measurement circuit will be below the threshold required for such deposition to occur.

Since the process is basically a current driven process, it is necessary to know what the current densities are at various locations on the car body in order to obtain the most uniform resin deposition and to provide a better understanding of how the process is working. Problems arise because of the changing geometries encountered when dealing with different automobile, van, and truck bodies in relation to the fixed anode geometries of the coating tanks. Therefore, a uniform coating thickness along the outside surface of the car body is difficult to achieve. Obtaining a minimum coating thickness on the corrosion prone internal cavities of the vehicle body such as rocker panels, fender wells, door pillars, etc. is even more difficult to achieve.

Current density, along with potential and temperature measurements can provide an insight into methods by which better coatings can be obtained, e.g. through a modification of the deposition tank geometry or changes in the design of the body parts or bodies themselves.

The apparatus according to the present invention will provide a better understanding of the physics of the electrocoat process by providing previously unobtainable data concerning the current densities required for the coating process. It may also facilitate improvements in the composition of the electrocoat resin by allowing better testing of new formulations. As an end result, vehicle manufacturers will obtain more evenly coated vehicles. By obtaining improved coating of corrosion prone areas, vehicle manufacturers will then be able to offer longer corrosion warranties and achieve a reduction of costs due to warranted corrosion-related repairs.

The invention has been described with reference to a preferred embodiment. Obviously, alterations and modifications will occur to others upon a reading and understanding of this specification. It is intended to include all such modifications and alterations insofar as they come within the scope of the appended claims or the equivalents thereof.

What is claimed is:

1. A current measuring device comprising:
   a transformer adapted for placement within a secondary flux source;
   an oscillator for periodically placing said transformer in forward and reverse flux saturation by application of a periodic voltage to an input winding thereof, whereby a period of the forward and reverse flux saturation is affected by the secondary flux source;

a pair of multi-section low pass filters operatively connected to an output winding of the transformer for generating an output signal including a slowly varying DC signal proportional to an on time of said transformer; and, amplifier means for processing the output signal of said pair of multi-section low pass filters, wherein said amplifier output is representative of a current sensed by said transformer.

2. The device of claim 1 further comprising a means for compensating for small output offsets due to component tolerance errors.

3. The device of claim 1 further comprising a means for improving the sensitivity of the transformer, said means for improving comprising a pair of voltage-sharing resistors.

4. The device of claim 1 further comprising a means for calibrating said amplifier.

5. The device of claim 1 further comprising a means for providing improved circuit stability for said oscillator and said amplifier.

6. A system for measuring parameters in an environment having a metallic body positioned in an electrolytic medium, comprising:

a current density sensing means positioned adjacent the metal body in a non-invasive manner, the current density sensing means including, a transformer including an input winding and output winding, an oscillator for periodically placing the transformer in flux saturation by application of a periodic voltage to the input winding, and means for generating a slowly varying DC output level signal from a signal received from the output winding in accordance with a timing of the flux saturation as influenced by current in the electrolytic medium;

an electrically and thermally insulative housing means for enclosing a least a portion of said current density sensing means in an electrically and thermally non-conductive manner;

a computer means for processing the current level signal from said current density sensing means; and, a wiring means for electrically interconnecting said computer means with said current density sensing means.

7. The system of claim 6 further comprising a temperature sensing means and a voltage sensing means each of which is located adjacent said current density sensing means in said housing means, wherein said wiring means also interconnects said temperature and voltage sensing means with said computer means so that said computer means can process the data therefrom.

8. The system of claim 6 further comprising a data acquisition means for processing an output signal from said current density sensing means before said output signal is sent to said computer means.

9. The system of claim 8 further comprising an enclosure means for housing said computer means and said data acquisition means in an environmentally isolated manner.

10. The system of claim 8 further comprising a trigger probe means for setting the initiation of a measuring cycle in the apparatus, said trigger probe means being in electrical contact with said data acquisition means.

11. The system of claim 10 wherein said trigger probe means comprises a housing, a means for securing said housing to the metallic body, and at least one sensor exposed to the electrolytic medium.

12. The system of claim 6 further comprising a means for securing said housing means to said metallic body.

13. The system of claim 6 wherein said current density sensing means comprises:

a toroidal transformer;

a square wave magnetically coupled oscillator which drives said toroidal transformer;

a pair of voltage sharing resistors to improve the sensitivity of said transformer;

a pair of multi-section low pass filters which monitor said transformer; and, a fixed gain differential instrumentation amplifier for processing an output of each of said filters.

14. The system of claim 6 wherein a plurality of current density sensing means are provided and further comprising:

a plurality of housing means, each enclosing at least a portion of one of said current density sensing means; and, a plurality of wiring means, each connecting a current density sensing means in one of said housing means to said computer means.

15. The system of claim 6 further comprising a means for providing electrical power to said current density sensing means.

16. A current density sensing means for directly measuring parameters adjacent the surface of a metallic body in contact with a surrounding electrolytic medium, being sufficiently sensitive to measure current density in a range of milliamps per square centimeter comprising:

means for periodically placing a transformer into magnetic flux saturation by application of a periodic voltage to an input winding thereof;

low pass filter means connected to an output winding of said transformer for generating a slowly varying DC signal proportional to detected alterations in periodicity of the magnetic flux resultant from a current flow in the metallic body;

amplifier means connected to said low pass filter means for detecting alterations in periodicity of the magnetic flux resultant from a current flow in the metallic body;

a temperature sensing means for measuring a temperature in the electrolytic medium adjacent said current density sensing means;

a voltage sensing means for measuring a voltage in the electrolytic medium adjacent said current density sensing means, and said voltage sensing means.

17. The apparatus of claim 16 further comprising a securing means for affixing said housing means to the metal structure.

18. The apparatus of claim 17 wherein said securing means comprises at least one suction cup.

19. The apparatus of claim 16 wherein said current density sensing means comprises:

a toroidal transformer;

a square wave magnetically coupled oscillator which drives said transformer;

a pair of voltage-sharing resistors to improve the sensitivity of said transformer;

a pair of multi-section low pass filters which monitor said transformer; and, a fixed gain differential instrumentation amplifier for processing an output of each of said filters.

20. The apparatus of claim 19 wherein said current density sensing means further comprises:
a means for compensating for small output offsets due to tolerance errors;
a means for providing improved circuit stability for said oscillator and said amplifier; and,
a means for calibrating said amplifier.

21. The apparatus of claim 15 further comprising a means for providing electrical power to said current density sensing means and said temperature sensing means.

22. A method of obtaining data concerning the deposition of a polymer resin onto a metallic substrate positioned in an electrolytic medium held in an electrocoating tank, comprising:
periodically placing a transformer into flux saturation;
generating a slowly varying DC signal representative of current density in said electrolytic medium in accordance with a fluctuation of a periodicity of said flux saturation;
securing said transformer to a metallic substrate;
lowering said metallic substrate into an electrolytic medium held in an electrocoating tank;
passing a current through said electrolytic medium thereby depositing a polymer resin contained in solution in said electrolytic medium onto said metallic substrate;
detecting a current density in the electrolytic medium adjacent said transformer; and,
recording information regarding current density detected by said transformer.

23. The method of claim 22 wherein a plurality of current density sensors are provided, each being secured, in a spaced manner, to said metallic substrate and further comprising the step of activating each sensor to perform said step of detecting current density.

24. The method of claim 23 wherein said step of activating each sensor is repeated a set number of times.

25. The method of claim 22 further comprising the steps of:
providing a trigger probe;
securing said trigger probe to said metallic substrate;
sensing a resistance less than a preselected maximum with said trigger probe; and,
subsequently triggering said step of detecting current density.

26. The method of claim 22 further comprising the step of reading out information obtained during said step of recording information.

27. The method of claim 22 further comprising the steps of:
sensing a temperature in said electrolytic medium simultaneously with said step of detecting current density; and,
recording information regarding temperature.

28. The method of claim 22 further comprising the steps of:
sensing a voltage in said electrolytic medium simultaneously with said step of detecting current density; and,
recording information regarding voltage.

29. The method of claim 22 further comprising the step of making a base line current density measurement before said step of detecting a current density.

30. A current measurement device comprising:
a transformer including a core, at least one input winding, and at least one output winding;
oscillator means for generating a square wave to induce forward and reverse saturation flux in said core;
means for communicating the square wave to an input winding of the transformer;
means adapted for placement of said core in an associated current field, whereby a flux level in said core is influenced thereby;
means for generating a composite signal, operatively connected to an output winding of the transformer, indicative of a flux level of the core;
means for generating a slowly varying DC current level signal indicative of a portion of said composite signal attributable to the associated current field;
means for establishing an offset flux level in the core; and,
means for amplifying the current level signal.

31. The current measurement device of claim 30 further comprising a means for varying a characteristic of the composite signal in accordance with said current level signal.

32. The current measurement device of claim 31 further comprising a means for inducing an initial flux level in the core.

33. The current measurement device of claim 32 further comprising a means for generating a voltage level in accordance with said composite signal, and wherein said current level signal is comprised of said voltage level.

34. The current measurement device of claim 30 wherein said means for amplifying comprises a device having a very high voltage gain, a high input impedance and a low output impedance.

* * * * *